(12) United States Patent
Moon

(10) Patent No.: US 8,009,497 B2
(45) Date of Patent: Aug. 30, 2011

(54) AUTO-REFRESH CONTROL CIRCUIT AND A SEMICONDUCTOR MEMORY DEVICE USING THE SAME

(75) Inventor: Hyung-Wook Moon, Ichon (KR)

(73) Assignee: Hynix Semiconductor Inc. (KR)

( * ) Notice: Subject to any disclaimer, the term of this patent is extended or adjusted under 35 U.S.C. 154(b) by 134 days.

(21) Appl. No.: 12/346,191

(22) Filed: Dec. 30, 2008

(65) Prior Publication Data

US 2010/0061173 A1 Mar. 11, 2010

(30) Foreign Application Priority Data

Sep. 10, 2008 (KR) ........................ 10-2008-0089074

(51) Int. Cl.
*G11C 7/00* (2006.01)
(52) U.S. Cl. ........................................ 365/222
(58) Field of Classification Search .............. 365/222 O, 365/222

See application file for complete search history.

(56) References Cited

U.S. PATENT DOCUMENTS

| 6,765,839 | B2 | 7/2004 | Park | |
| 7,349,277 | B2 * | 3/2008 | Kinsley et al. | 365/222 |
| 7,619,912 | B2 * | 11/2009 | Bhakta et al. | 365/51 |
| 2008/0168262 | A1 * | 7/2008 | Bellows et al. | 712/225 |

FOREIGN PATENT DOCUMENTS

| JP | 2004-005933 | 1/2004 |
| KR | 1020000052491 | 8/2000 |
| KR | 1020000052491 A | 8/2000 |
| KR | 1020050046427 | 5/2005 |
| KR | 1020050046427 A | 5/2005 |
| KR | 1020060079288 | 7/2006 |
| KR | 1020070115260 | 12/2007 |

* cited by examiner

*Primary Examiner* — VanThu Nguyen
(74) *Attorney, Agent, or Firm* — Baker & McKenzie LLP

(57) ABSTRACT

An auto-refresh control circuit includes a control signal generating section configured to simultaneously or individually enable first and second control signals in response to an information combination signal having refresh information and operation mode information and first and second chip selection signals, and an auto-refresh signal generating section configured to generate first and second auto-refresh signals in response to a plurality of command signals and the first and second control signals.

16 Claims, 4 Drawing Sheets

AUTO-REFRESH CONTROL CIRCUIT AND A SEMICONDUCTOR MEMORY DEVICE USING THE SAME

CROSS-REFERENCES TO RELATED APPLICATION

The present application claims priority under 35 U.S.C. §119(a) to Korean Application Number 10-2008-0089074, filed on Sep. 10, 2008, in the Korean Intellectual Property Office, which is incorporated herein by reference in its entirety as if set forth in full.

BACKGROUND

1. Technical Field

The embodiments described herein relate to semiconductor memory device, and more particularly, to an auto-refresh control circuit and a semiconductor memory device using the same.

2. Related Art

Currently, a 2-rank DRAM device that operates as if two independent chips were built in one chip has been developed. The 2-rank DRAM device indicates a DRAM device that can operate as a single rank or two ranks. The 2-rank DRAM device can allow first and second ranks to operate cooperatively as a single rank or independently as two ranks by using two chip selection signals that are commands for selecting chips. Describing a 1 Gb DRAM for example, the 1 Gb DRAM is formed to have two ranks, and two chip selection signals are used to allow the two ranks to operate independently or cooperatively.

In the 2-rank DRAM device, when the first and second ranks operate cooperatively as a single rank, it is necessary for the first and second ranks to perform auto-refresh operation together. In addition, in the 2-rank DRAM, when the first and second ranks operate independently from each other, it is necessary for the first and second ranks to perform auto-refresh operation simultaneously or individually.

SUMMARY

An auto-refresh control circuit capable of allowing auto-refresh operation to be performed simultaneously or individually when two ranks of a semiconductor memory device operate independently from each other is described herein.

In one aspect, an auto-refresh control circuit includes a control signal generating section configured to simultaneously or individually enable first and second control signals in response to an information combination signal having refresh information and operation mode information and first and second chip selection signals, and an auto-refresh signal generating section configured to generate first and second auto-refresh signals in response to a plurality of command signals and the first and second control signals.

In another aspect, a semiconductor memory device includes a first rank performing auto-refresh operation in response to a first auto-refresh signal, a second rank performing auto-refresh operation in response to a second auto-refresh signal, and an auto-refresh control circuit configured to simultaneously or individually enable the first and second auto-refresh signals in response to an information combination signal having refresh information and operation mode information, first and second chip selection signals, and a plurality of command signals.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
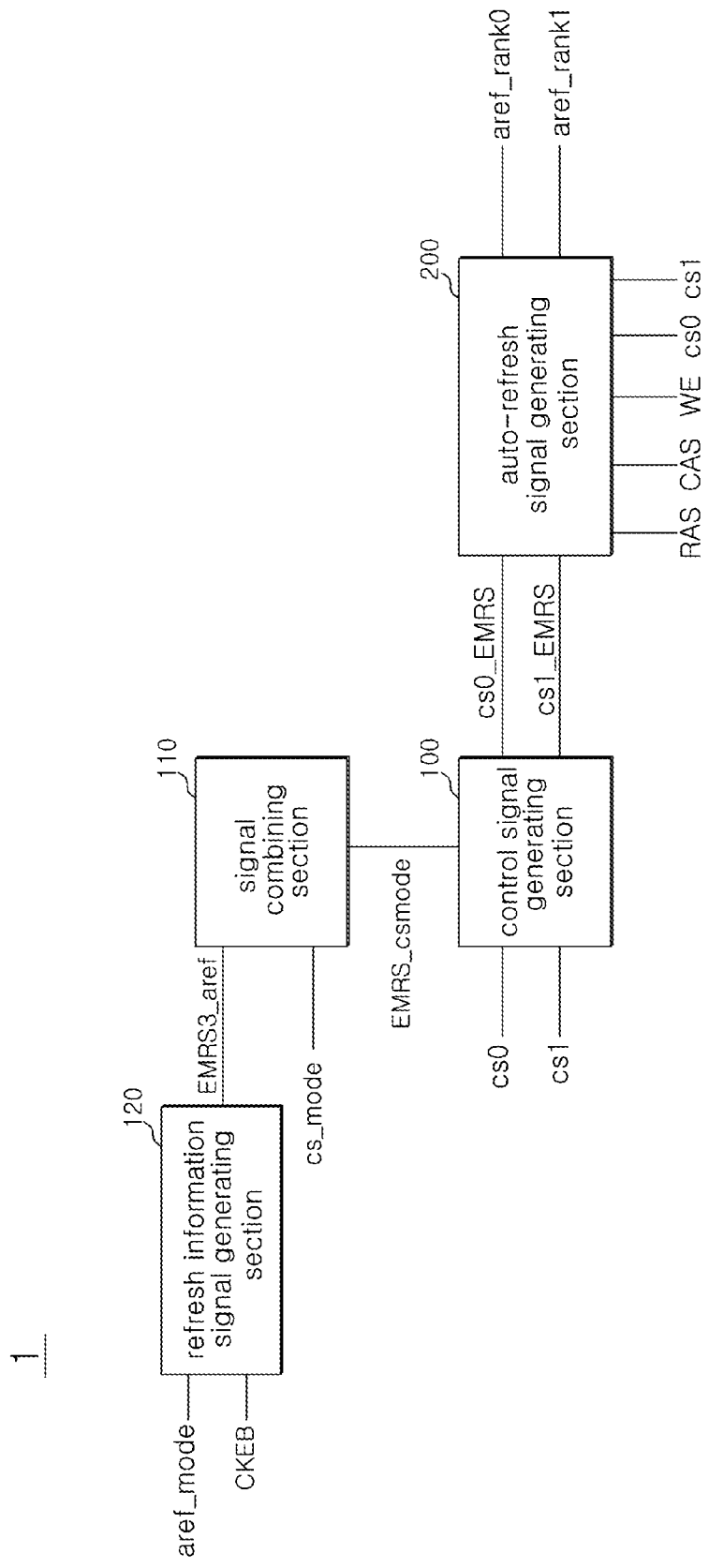
FIG. 1 is a schematic block diagram of an exemplary auto-refresh control circuit according to one embodiment.

FIG. 1 is a schematic block diagram of an exemplary auto-refresh control circuit according to one embodiment. In FIG. 1, an auto-refresh control circuit 1 can be configured to include a control signal generating section 100 and an auto-refresh signal generating section 200.

The control signal generating section 100 can enable first and second control signals 'cs0_EMRS' and 'cs1_EMRS' simultaneously or individually in response to an information combination signal 'EMRS_csmode' that has refresh information and operation mode information and first and second chip selection signals 'cs0' and 'cs1'.

In addition, the auto-refresh control circuit 1 can include a signal combining section 110. Here, the signal combining section 110 can receive input of a refresh information signal 'EMRS3_aref' having the refresh information and an operation mode signal 'cs_mode' having the operation mode information. Accordingly, by combining these signals, signal combining section 110 can generate the information combination signal 'EMRS_csmode'.

The refresh information signal 'EMRS3_aref' is a signal for determining whether respective two ranks perform auto-refresh operation simultaneously or individually when the two ranks of a semiconductor memory device operate independently from each other. For example, the refresh information signal 'EMRS3_aref' can be a signal having a high level when the auto-refresh operation is performed simultaneously by the respective ranks or can be a signal having a low level when the auto-refresh operation is performed individually by the respective ranks.

The operation mode signal 'cs_mode' is a signal having the operation mode information. Accordingly, when the semiconductor memory device is composed of the two ranks, the operation mode signal 'cs_mode' can be a signal for determining whether the two ranks operate cooperatively like a single rank or independently from each other. For example, in the semiconductor memory device composed of the two ranks, when the two ranks operate independently from each other, the operation mode signal 'cs_mode' can be enabled to a high level, and when the two ranks operate cooperatively like a single rank, the operation mode signal 'cs_mode' can be disabled to a low level. The operation mode signal 'cs_mode' is, for example, a signal that can be generated through a mode register set (MRS).

Accordingly, the information combination signal 'EMRS_csmode' can be a signal that has both the refresh information and the operation mode information. For example, assuming that the two ranks operate independently from each other, i.e., the operation mode signal 'cs_mode' is enabled to a high level, the information combination signal 'EMRS_csmode' may be a signal having a low level when the two ranks perform the auto-refresh operation simultaneously or a signal having a high level when the two ranks perform the auto-refresh operation individually.

In FIG. 1, the control signal generating section 100 can generate first and second control signals 'cs0_EMRS' and 'cs1_EMRS' in response to the information combination signal 'EMRS_csmode' and the first and second chip selection signals 'cs0' and 'cs1'. When the information combination signal 'EMRS_csmode' has a low level, the control signal generating section 100 can enable both the first and second control signals 'cs0_EMRS' and 'cs1_EMRS' irrespective of the first and second chip selection signals 'cs0' and 'cs1'. When the information combination signal 'EMRS_csmode' has a high level, the control signal generating section 100 can enable the first control signal 'cs0_EMRS' or the second control signal 'cs1_EMRS' depending upon which of the first and second chip selection signals 'cs0' and 'cs1' is enabled. For example, when the information combination signal 'EMRS_csmode' has a high level, if the first chip selection signal 'cs0' is enabled and the second chip selection signal 'cs1' is disabled, then the first control signal 'cs0_EMRS' can be enabled and the second control signal 'cs1_EMRS' can be disabled.

The chip selection signals 'cs0' and 'cs1' can be signals that are input from an exterior through input pins to select a rank to be operated when the respective ranks of the semiconductor memory device operate independently from each other. For example, when only the first rank is to operate, the first chip selection signal 'cs0' can be enabled, and the second chip selection signal 'cs1' can be disabled. When both the first and second ranks are to operate, both the first and second chip selection signals 'cs0' and 'cs1' can be enabled.

In addition, the auto-refresh control circuit 1 can include a refresh information signal generating section 120 for generating the refresh information signal 'EMRS3_aref'. Here, the refresh information signal generating section 120 can be input with an auto-refresh mode signal 'aref_mode' and a clock enable signal 'CKE', and can generate the refresh information signal 'EMRS3_aref'.

The refresh information signal generating section 120 is input with the auto-refresh mode signal 'aref_mode' and can be provided to determine whether the two ranks perform the auto-refresh operation cooperatively or independently from each other. For example, the auto-refresh mode signal 'aref_mode' can be a signal having a high level to allow the two ranks to perform the auto-refresh operation cooperatively or a signal having a low level to allow the two ranks to perform the auto-refresh operation independently from each other. Here, the auto-refresh mode signal 'aref_mode' can be a signal that can be input through a mode register set that is provided to the semiconductor memory device. Alternatively, the auto-refresh mode signal 'aref_mode' can be generated not only through the mode register set but also by using a test mode signal or through a fuse.

The clock enable signal 'CKE' can be a signal that is maintained to be enabled to a high level when the semiconductor memory device is in an active state. The refresh information signal generating section 120 is input with the clock enable signal 'CKE' and can be provided also to distinguish between the auto-refresh operation and self refresh operation. For example, the auto-refresh operation can be performed when the semiconductor memory device is in an active state, and, unlike the auto-refresh operation, the self refresh operation can be performed when the semiconductor memory device is in a standby state. Thus, the clock enable signal 'CKE' can be kept disabled to a low level while the self refresh operation is performed. Since the refresh information signal generating section 120 can be input with a signal 'CKEB' that is obtained by inverting the clock enable signal 'CKE', the refresh information signal generating section 120 can generate the refresh information signal 'EMRS3_aref' of a high level when the self refresh operation is performed. For example, the refresh information signal generating section 120 can generate the refresh information signal 'EMRS3_aref' of a high level when the self refresh operation is performed or the two respective ranks cooperatively perform the auto-refresh operation, and generates the refresh information signal 'EMRS3_aref' of a low level when the two respective ranks perform the auto-refresh operation independently from each other.

In FIG. 1, the auto-refresh signal generating section 200 can generate first and second auto-refresh signals 'aref_rank0' and 'aref_rank1' in response to a plurality of command signals 'RAS', 'CAS' and 'WE' and the first and second control signals 'cs0_EMRS' and 'cs1_EMRS'. The plurality of command signals 'RAS', 'CAS', 'WE', 'cs0' and 'cs1' can be command signals that are input through the input pins of the semiconductor memory device, and can include a row address strobe signal 'RAS', a column address strobe signal 'CAS', a write enable signal 'WE', and the chip selection signals 'cs0' and 'cs1'. In general, the semiconductor memory device can perform active operation, precharge operation, read operation, write operation, auto-refresh operation, etc. by combining these command signals.

The first and second auto-refresh signals 'aref_rank0' and 'aref_rank1' can be signals that allow the respective ranks of the semiconductor memory device to perform the auto-refresh operation. For example, if the first auto-refresh signal 'aref_rank0' is enabled and the second auto-refresh signal 'aref_rank1' is disabled, then only the first rank can perform the auto-refresh operation.

Figure 2:
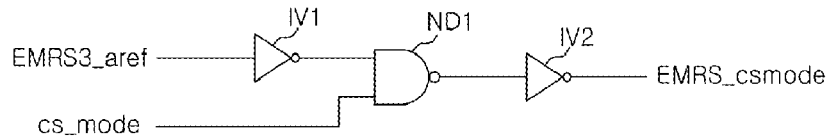
FIG. 2 is a schematic circuit diagram of an exemplary signal combining section capable of being implemented in the circuit of FIG. 1 according to one embodiment.

FIG. 2 is a schematic circuit diagram of an exemplary signal combining section capable of being implemented in the circuit of FIG. 1 according to one embodiment. In FIG. 2, the signal combining section 110 can include a first inverter IV1, a second inverter IV2, and a first NAND gate ND1. Here, the first inverter IV1 can invert the refresh information signal 'EMRS3_aref', the first NAND gate ND1 can be input with the output of the first inverter IV1 and the operation mode signal 'cs_mode', and the second inverter IV2 can invert the output of the first NAND gate ND1 and can generate the information combination signal 'EMRS_csmode'. Accordingly, only when the refresh information signal 'EMRS3_aref' has a low level and the operation mode signal 'cs_mode' has a high level (the two ranks operate independently from each other to perform the auto-refresh operation), can the signal combining section 110 enable the information combination signal 'EMRS_csmode' to a high level.

Figure 3:
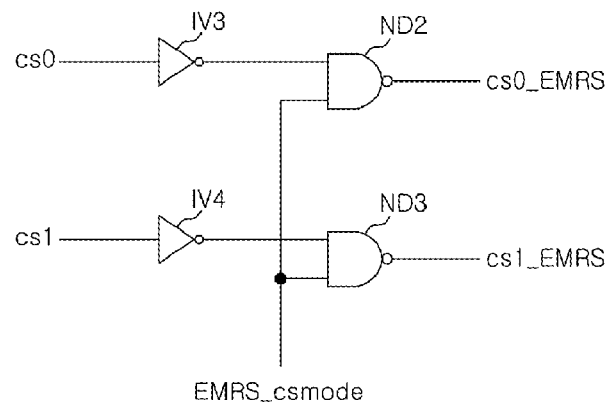
FIG. 3 is a schematic circuit diagram of an exemplary control signal generating section capable of being implemented in the circuit of FIG. 1 according to one embodiment.

FIG. 3 is a schematic circuit diagram of an exemplary control signal generating section capable of being implemented in the circuit of FIG. 1 according to one embodiment. In FIG. 3, the control signal generating section 100 can include a third inverter IV3, a fourth inverter IV4, a second NAND gate ND2, and a third NAND gate ND3. Here, the third inverter IV3 can invert the first chip selection signal 'cs0', and the fourth inverter IV4 can invert the second chip selection signal 'cs1'. In addition, the second NAND gate ND2 can be input with the output of the third inverter IV3 and the information combination signal 'EMRS_csmode', and can generate the first control signal 'cs0_EMRS'. Furthermore, the third NAND gate ND3 can be input with the output of the fourth inverter IV4 and the information combination signal 'EMRS_csmode', and can generate the second control signal 'cs1_EMRS'. Accordingly, if the information combination signal 'EMRS_csmode' has a low level, the control signal generating section 100 can enable both of the first and second control signals 'cs0_EMRS' and 'cs1_EMRS' irrespective of the first and second chip selection signals 'cs0' and 'cs1'. If the information combination signal 'EMRS_csmode' has a high level, then the control signal generating section 100 can enable the first control signal 'cs0_EMRS' or the second control signal 'cs1_EMRS' depending upon which of the first and second chip selection signals 'cs0' and 'cs1' is enabled.

Figure 4:
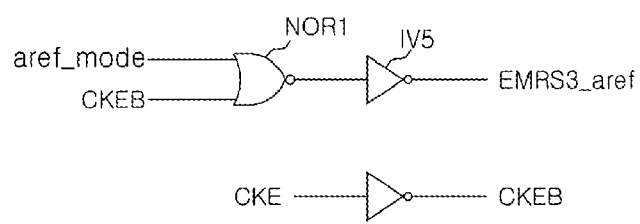
FIG. 4 is a schematic circuit diagram of an exemplary refresh information signal generating section capable of being implemented in the circuit of FIG. 1 according to one embodiment.

FIG. 4 is a schematic circuit diagram of an exemplary refresh information signal generating section capable of being implemented in the circuit of FIG. 1 according to one embodiment. In FIG. 4, the refresh information signal generating section 120 can include a first NOR gate NOR1 and a fifth inverter IV5. Here, the first NOR gate NOR1 can be input with the auto-refresh mode signal 'aref_mode' and the signal 'CKEB' obtained by the inverting the clock enable signal 'CKE'. In addition, the fifth inverter IV5 can invert the output of the first NOR gate NOR1. Accordingly, only when both of the auto-refresh mode signal 'aref_mode' and the signal 'CKEB' obtained by the inverting the clock enable signal 'CKE' have low levels, the refresh information signal generating section 120 can generate the refresh information signal 'EMRS3_aref' that is disabled to a low level.

Figure 5:
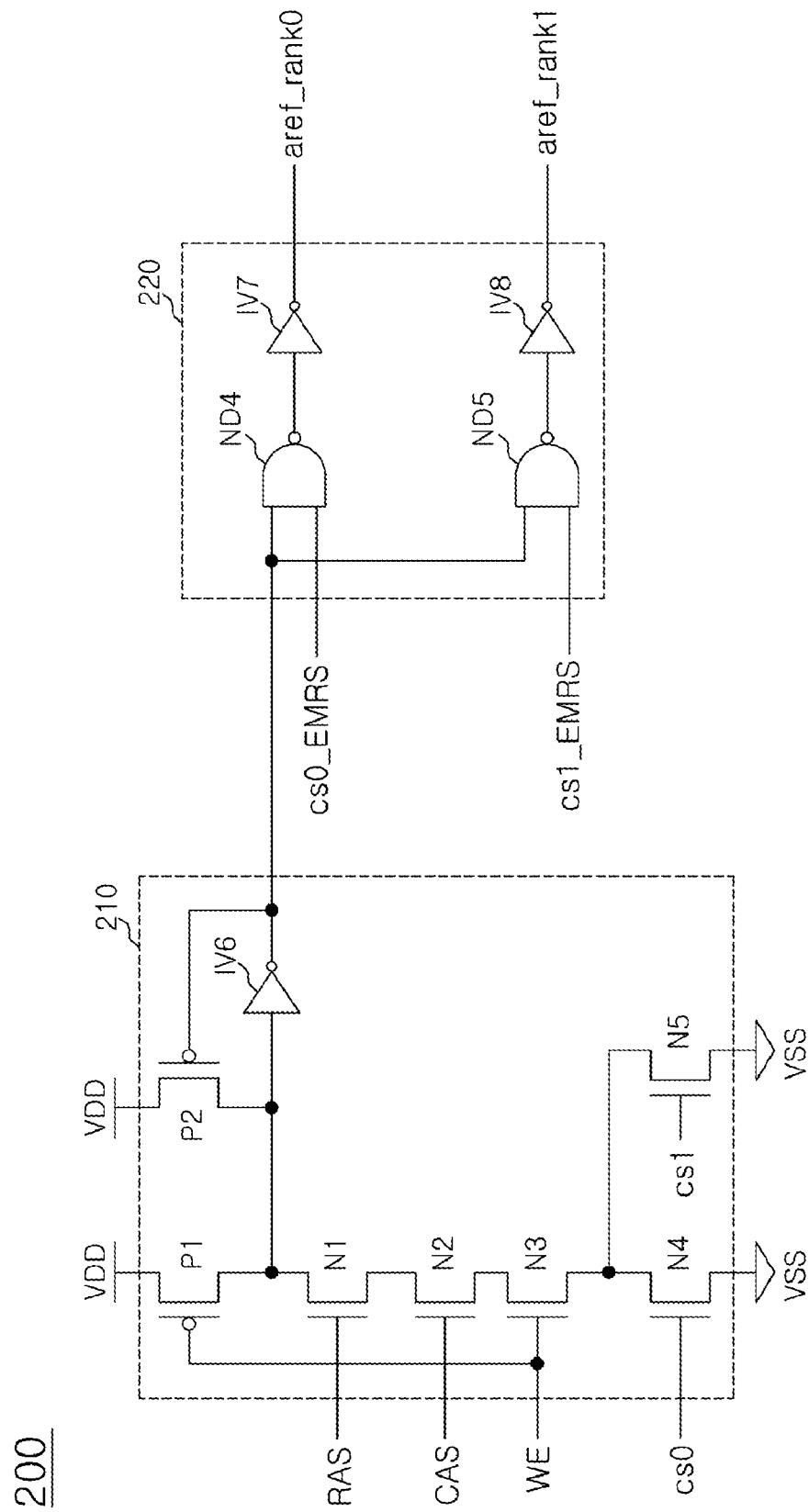
FIG. 5 is a schematic circuit diagram of an exemplary auto-refresh signal generating section capable of being implemented in the circuit of FIG. 1 according to one embodiment.

FIG. 5 is a schematic circuit diagram of an exemplary auto-refresh signal generating section capable of being implemented in the circuit of FIG. 1 according to one embodiment. In FIG. 5, the auto-refresh signal generating section 200 can include a command decoding unit 210 and an auto-refresh signal output unit 220.

The command decoding unit 210 can include first and second PMOS transistors P1 and P2, first to fifth NMOS transistors N1-N5, and a sixth inverter IV6. The command decoding unit 210 can receive input of the plurality of command signals 'RAS', 'CAS', 'WE', 'cs0' and 'cs1', and, by decoding these command signals, can determine which operation will be performed by the semiconductor memory device. For example, when the auto-refresh operation will be performed, the signals 'RAS', 'CAS' and 'WE' can be all enabled to high levels, and the first and second chip selection signals 'cs0' and 'cs1' can be enabled simultaneously or individually to high levels depending upon an operation mode. Thus, when the auto-refresh operation is performed, the command decoding unit 210 can output the signals that are enabled to high levels.

In FIG. 5, the auto-refresh signal output unit 220 can generate the first and second auto-refresh signals 'aref_rank0' and 'aref_rank1' in response to the output of the command decoding unit 210 and the first and second control signals 'cs0_EMRES' and 'cs1_EMRS'. When the output of the command decoding unit 210 is enabled, the auto-refresh signal outputting unit 220 can enable the first and second auto-refresh signals 'aref_rank0' and 'aref_rank1' depending upon whether the first and second control signals 'cs0_EMRES' and 'cs1_EMRS' are enabled. For example, if the two ranks of the semiconductor memory device operate individually, such that the first control signal 'cs0_EMRS' is enabled and the second control signal 'cs1_EMRS' is disabled, only the first auto-refresh signal 'aref_rank0' can be enabled so that only the first rank can perform the auto-refresh operation.

The auto-refresh signal output unit 220 can also include a fourth NAND gate ND4, a fifth NAND gate ND5, a seventh inverter IV7, and an eighth inverter IV8. Here, the fourth NAND gate ND4 can be input with the output of the command decoding unit 210 and the first control signal 'cs0_EMRS', and the seventh inverter IV7 can invert the output of the fourth NAND gate ND4 and generates the first auto-refresh signal 'aref_rank0'. In addition, the fifth NAND gate ND5 can be input with the output of the command decoding unit 210 and the second control signal 'cs1_EMRS', and the eighth inverter IV8 can invert the output of the fifth NAND gate ND5 and can generate the second auto-refresh signal 'aref_rank1'.

An exemplary operation of the auto-refresh control circuit will be described with reference to FIGS. 1-5.

In the semiconductor memory device composed of the two ranks, when the two ranks operate cooperatively like a single rank, the operation mode signal 'cs_mode' can be disabled to a low level. Accordingly, the signal combining section 110 can disable the information combination signal 'EMRS_csmode' irrespective of the refresh information signal 'EMRS3_aref'. Since the information combination signal 'EMRS_csmode' has a low level, the control signal generating section 100 can enable both the first and second control signals 'cs0_EMRS' and 'cs1_EMRS' to high levels irrespective of the first and second chip selection signals 'cs0' and 'cs1'.

Then, the command decoding unit 210 can combine the command signals 'RAS', 'CAS', 'WE', 'cs0' and 'cs1', and can output a signal that is enabled to a high level so that the auto-refresh operation can be performed. Accordingly, the auto-refresh signal output unit 220 can enable both of the first and second auto-refresh signals 'aref_rank0' and 'aref_rank1', such that both the first and second ranks can perform the auto-refresh operation.

Conversely, when the two ranks operate independently from each other, the operation mode signal 'cs_mode' can be enabled to a high level. Accordingly, the information combination signal 'EMRS_csmode' can become a high level or a low level depending upon the refresh information signal 'EMRS3_aref'. First, when the respective ranks perform the auto-refresh operation individually, the auto-refresh mode signal 'aref_mode' can be input to the refresh information signal generating section 120 as a signal having a low level. Thus, the refresh information signal generating section 120 can be input with the auto-refresh mode signal 'aref_mode' having a low level and the inverted clock enable signal 'CKEB' having a low level, and can generate the refresh information signal 'EMRS3_aref' having a low level.

The signal combining section 110 can be input with the operation mode signal 'cs_mode' having a high level and the refresh information signal 'EMRS3_aref' having a low level, and can generate the information combination signal 'EMRS_csmode' having a high level. Accordingly, the control signal generating section 100 can individually enable the first control signal 'cs0_EMRS' or the second control signal 'cs1_EMRS' depending upon which of the first and second chip selection signals 'cs0' and 'cs1' is enabled. For example, when the information combination signal 'EMRS_csmode' has a high level, if the first chip selection signal 'cs0' is enabled and the second chip selection signal 'cs1' is disabled, then the first control signal 'cs0_EMRS' can be enabled and the second control signal 'cs1_EMRS' can be disabled.

If the command decoding unit 210 outputs the signal enabled to a high level to perform the auto-refresh operation, then the auto-refresh signal output unit 220 can individually enable the first auto-refresh signal 'aref_rank0' or the second auto-refresh signal 'aref_rank1' depending upon which of the first and second control signals 'cs0_EMRS' and 'cs1_EMRS' is enabled, such that the respective ranks can individually perform the auto-refresh operation.

Next, when the two ranks operate independently from each other, in order to allow the two ranks to simultaneously perform the auto-refresh operation, the auto-refresh mode signal 'aref_mode' can be input to the refresh information signal generating section 120 as a signal having a low level. Accordingly, the refresh information signal generating section 120 can generate the refresh information signal 'EMRS3_aref' having a high level.

The signal combining section 110, which can be input with the refresh information signal 'EMRS3_aref' having a high level and the operation mode signal 'cs_mode' having a high level, can generate the information combination signal 'EMRS_csmode' having a low level. Accordingly, the control signal generating section 100, which can be input with the information combination signal 'EMRS_csmode' having a low level, can enable both the first and second control signals 'cs0_EMRS' and 'cs1_EMRS' irrespective of whether the first and second chip selection signals 'cs0' and 'cs1' are enabled. Thus, as the auto-refresh signal generating section 200 can simultaneously enable the first and second auto-refresh signals 'aref_rank0' and 'aref_rank1', even though the two ranks operate independently from each other, the respective ranks can simultaneously perform the auto-refresh operation.

Figure 6:
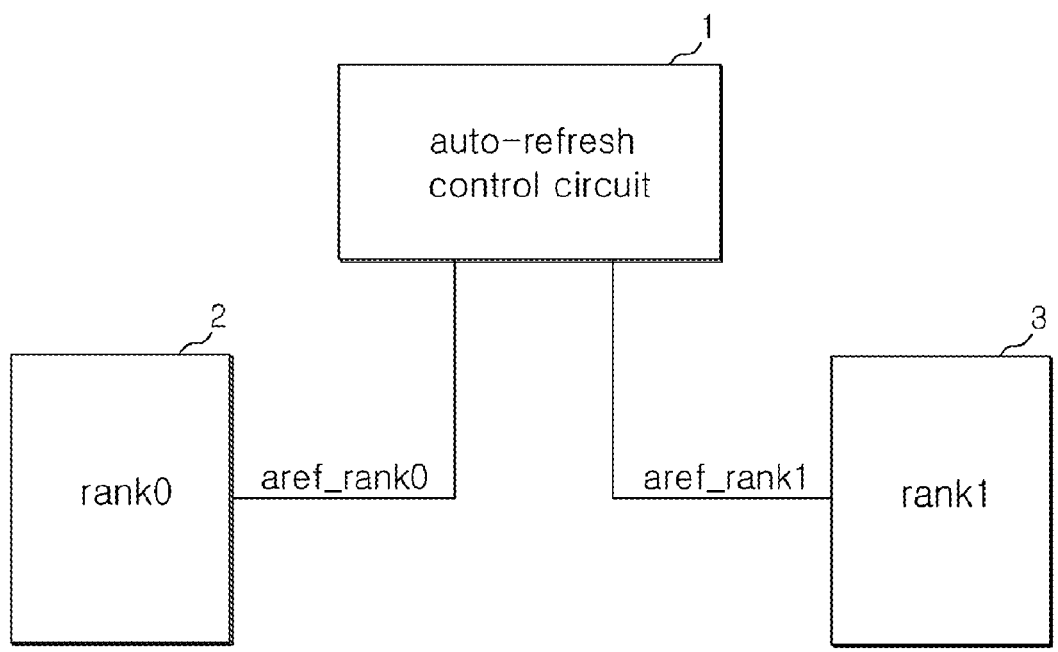
FIG. 6 is a schematic block diagram of an exemplary semiconductor memory device according to one embodiment.

FIG. 6 is a schematic block diagram of an exemplary semiconductor memory device according to one embodiment. In FIG. 6, the semiconductor memory device 10 can be configured to include a first rank 2, a second rank 3, and the auto-refresh control circuit 1. Here, the auto-refresh control circuit 1 can simultaneously or individually enable the first and second auto-refresh signals 'aref_rank0' and 'aref_rank1' in response to the information combination signal 'EMRS_csmode' having the refresh information and the operation mode information, the first and second chip selection signals 'cs0' and 'cs1', and the plurality of command signals 'RAS', 'CAS' and 'WE'. Accordingly, the first rank 2 can perform the auto-refresh operation in response to the first auto-refresh signal 'aref_rank0', and the second rank 3 can perform the auto-refresh operation in response to the second auto-refresh signal 'aref_rank1'.

In the semiconductor memory device 10, when the first and second ranks 2 and 3 operate cooperatively like a single rank, control can be made such that the first and second ranks 2 and 3 can cooperatively perform the auto-refresh operation, and when the first and second ranks 2 and 3 operate independently from each other, control can be made such that only an operating rank performs the auto-refresh operation or the respective ranks can simultaneously perform the auto-refresh operation.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. An auto-refresh control circuit, comprising:
a control signal generating section configured to simultaneously or individually enable first and second control signals in response to an information combination signal having refresh information and operation mode information and first and second chip selection signals;
an auto-refresh signal generating section configured to generate first and second auto-refresh signals in response to a plurality of command signals and the first and second control signals;
a signal combining section configured to be input with a refresh information signal having the refresh information and an operation mode signal having the operation mode information and to generate the information combination signal; and
a refresh information signal generating section configured to be input with an auto-refresh mode signal and a clock enable signal and generate the refresh information signal.

2. The auto-refresh control circuit according to claim 1, wherein the signal combining section enables the information combination signal when the refresh information signal is disabled and the operation mode signal is enabled.

3. The auto-refresh control circuit according to claim 1, wherein the control signal generating section enables both the first and second control signals irrespective of the first and second chip selection signals when the information combination signal is disabled.

4. The auto-refresh control circuit according to claim 1, wherein the control signal generating section enables one of the first control signal and the second control signal depending upon which of the first and second chip selection signals is enabled when the information combination signal is enabled.

5. The auto-refresh control circuit according to claim 1, wherein the auto-refresh mode signal is generated through a mode register set.

6. The auto-refresh control circuit according to claim 1, wherein the auto-refresh mode signal is generated using one of a test mode signal and through a fuse circuit.

7. The auto-refresh control circuit according to claim 1, wherein the auto-refresh signal generating section comprises:
a command decoding unit receiving and combining the plurality of command signals and the first and second chip selection signals; and
an auto-refresh signal output unit generating the first and second auto-refresh signals in response to an output of the command decoding unit and the first and second control signals.

8. A semiconductor memory device, comprising:
a first rank performing auto-refresh operation in response to a first auto-refresh signal;
a second rank performing auto-refresh operation in response to a second auto-refresh signal;
an auto-refresh control circuit configured to simultaneously or individually enable the first and second auto-refresh signals in response to an information combination signal having refresh information and operation mode information, first and second chip selection signals, and a plurality of command signals;
a signal combining section configured to be input with a refresh information signal having the refresh information and an operation mode signal having the operation mode information and generating the information combination signal; and a refresh information signal generating section configured to be input with an auto-refresh mode signal and a clock enable signal and generate the refresh information signal, wherein the auto-refresh control circuit comprises:
- a control signal generating section configured to simultaneously or individually enable first and second control signals in response to the information combination signal and the first and second chip selection signals; and
- an auto-refresh signal generating section configured to generate the first and second auto-refresh signals in response to the plurality of command signals and the first and second control signals.

9. The semiconductor memory device according to claim 8, wherein the signal combining section enables the information combination signal when the refresh information signal is disabled and the operation mode signal is enabled.

10. The semiconductor memory device according to claim 8, wherein the control signal generating section enables both the first and second control signals irrespective of the first and second chip selection signals when the information combination signal is disabled.

11. The semiconductor memory device according to claim 8, wherein the control signal generating section enables one of the first control signal and the second control signal depending upon which of the first and second chip selection signals is enabled when the information combination signal is enabled.

12. The semiconductor memory device according to claim 8, wherein the auto-refresh mode signal is generated through a mode register set.

13. The semiconductor memory device according to claim 8, wherein the auto-refresh mode signal is generated using one of a test mode signal and through a fuse circuit.

14. The semiconductor memory device according to claim 8, wherein the auto-refresh signal generating section comprises:
- a command decoding unit receiving and combining the plurality of command signals and the first and second chip selection signals; and
- an auto-refresh signal output unit generating the first and second auto-refresh signals in response to an output of the command decoding unit and the first and second control signals.

15. The semiconductor memory device according to claim 8, wherein the operation mode information has information regarding whether the first and second ranks entirely operate as a single rank or the first and second rank operate individually.

16. The semiconductor memory device according to claim 15, wherein the refresh information has information regarding whether the auto-refresh operation of the first and second ranks are simultaneously performed or individually performed when the first and second ranks operate individually.

* * * * *